United States Patent
Yamamoto et al.

(10) Patent No.: US 10,401,172 B2
(45) Date of Patent: Sep. 3, 2019

(54) ANGULAR VELOCITY ACQUISITION DEVICE AND ELECTRONIC COMPONENT FOR ACQUIRING ANGULAR VELOCITY

(71) Applicant: KABUSHIKI KAISHA TOSHIBA, Tokyo (JP)

(72) Inventors: Haruka Yamamoto, Yokohama Kanagawa (JP); Yasushi Tomizawa, Fuchu Tokyo (JP); Tamio Ikehashi, Yokohama Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 229 days.

(21) Appl. No.: 15/243,511

(22) Filed: Aug. 22, 2016

(65) Prior Publication Data
US 2017/0268878 A1    Sep. 21, 2017

(30) Foreign Application Priority Data
Mar. 16, 2016    (JP) ................................ 2016-052461

(51) Int. Cl.
*G01C 19/56*    (2012.01)
*B81B 3/00*    (2006.01)
*G01C 19/5762*    (2012.01)
*G01C 19/5733*    (2012.01)

(52) U.S. Cl.
CPC ..... *G01C 19/5762* (2013.01); *G01C 19/5733* (2013.01); *B81B 3/0054* (2013.01)

(58) Field of Classification Search
None
See application file for complete search history.

(56) References Cited

U.S. PATENT DOCUMENTS

| 6,928,872 | B2 | 8/2005 | Durante et al. | |
| 2009/0320592 | A1* | 12/2009 | Glenn | B81B 3/0051 73/504.12 |
| 2010/0126270 | A1* | 5/2010 | Terada | G01C 19/5719 73/504.12 |
| 2016/0298966 | A1 | 10/2016 | Ikehashi | |

* cited by examiner

*Primary Examiner* — Matthew G Marini
*Assistant Examiner* — Ruben C Parco, Jr.
(74) *Attorney, Agent, or Firm* — Kim & Stewart LLP

(57) ABSTRACT

An angular velocity acquisition device includes a movable body, a drive electrode to which a drive voltage is applied to vibrate the movable body in a first direction, at least one stopper that stops the movable body at a predetermined position, a hold electrode which receives a hold voltage to hold the movable body at the predetermined position, a detection unit that detects a predetermined physical quantity depending on an amplitude of the vibration of the movable body in a second direction based on a Coriolis force acting on the movable body that vibrates in the first direction, and an angular velocity calculation unit that calculates an angular velocity of the movable body based on the predetermined physical quantity detected by the detection unit.

10 Claims, 7 Drawing Sheets

ANGULAR VELOCITY ACQUISITION DEVICE AND ELECTRONIC COMPONENT FOR ACQUIRING ANGULAR VELOCITY

CROSS-REFERENCE TO RELATED APPLICATION

This application is based upon and claims the benefit of priority from Japanese Patent Application No. 2016-052461, filed Mar. 16, 2016, the entire contents of which are incorporated herein by reference.

FIELD

Embodiments described herein relate generally to an angular velocity acquisition device and an electronic component for acquiring an angular velocity.

BACKGROUND

In an angular velocity acquisition device using a gyro sensor, angular velocity is acquired from the amplitude of vibration of a movable body based on Coriolis force acting on the movable body.

However, in an angular velocity acquisition device of the related art using a gyro sensor, there is a problem that power consumption is increased.

DETAILED DESCRIPTION

Embodiments provide an angular velocity acquisition device which can reduce power consumption, and an electronic component for acquiring an angular velocity.

In general, according to an embodiment, an angular velocity acquisition device includes a movable body; a drive electrode configured to receive a drive voltage to vibrate the movable body in a first direction; at least one stopper configured to stop the movable body at a predetermined position; a hold electrode configured to receive a hold voltage to hold the movable body at the predetermined position; a detection unit configured to detect a predetermined physical quantity depending on an amplitude of the vibration of the movable body in a second direction based on a Coriolis force acting on the movable body as it vibrates in the first direction; and an angular velocity calculation unit configured to calculate an angular velocity of the movable body based on the predetermined physical quantity detected by the detection unit.

Hereinafter, an embodiment will be described with reference to the drawings.

Figure 1:
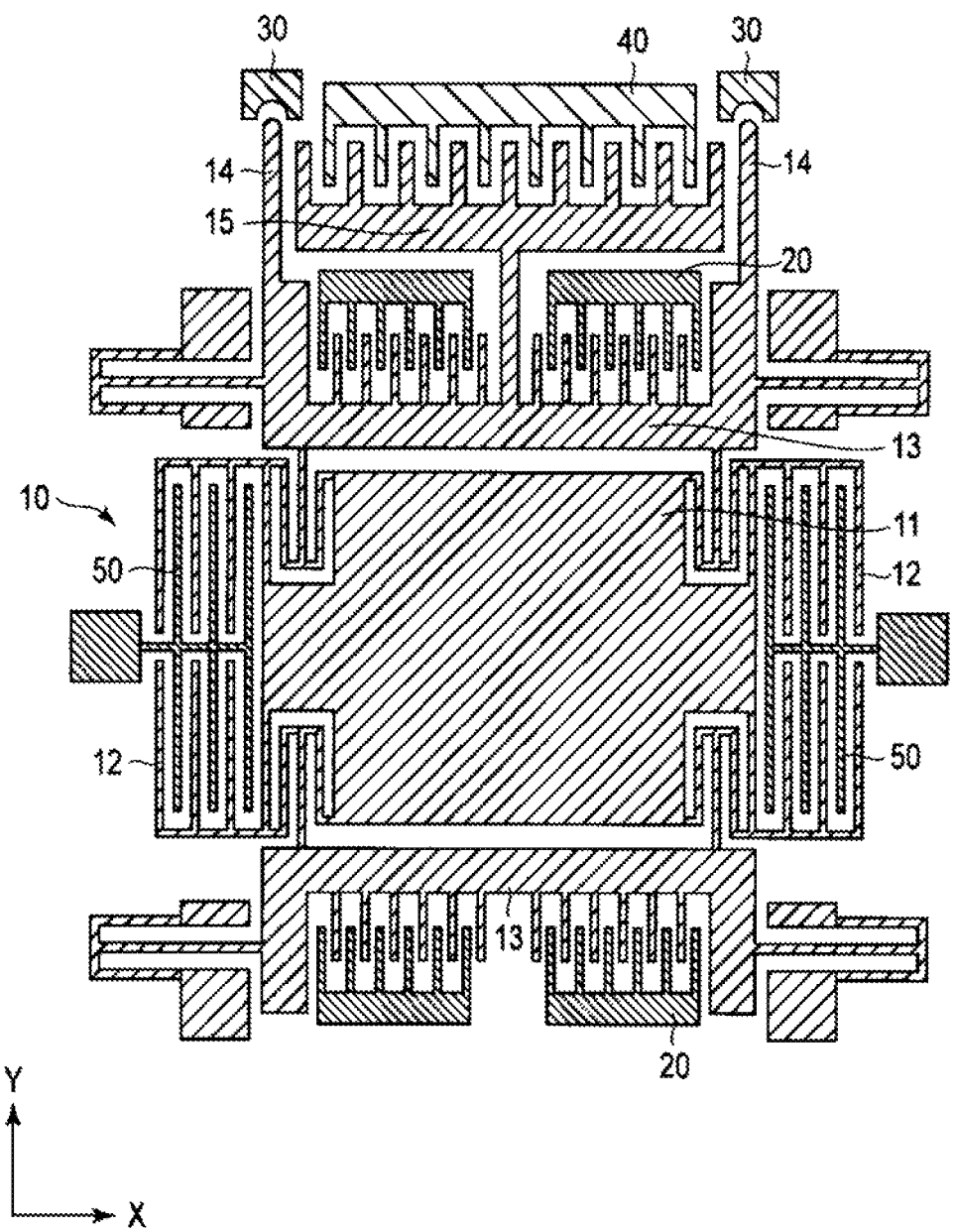
FIG. 1 is a plan view schematically illustrating a configuration of an electronic component for acquiring an angular velocity according to an embodiment.

FIG. 1 is a plan view schematically illustrating a configuration of an electronic component for acquiring an angular velocity according to an embodiment. The electronic component for acquiring the angular velocity according to the embodiment is formed using micro electro-mechanical systems (MEMS) techniques and it is used as a sensing component of a gyro sensor.

The electronic component (MEMS component) for acquiring the angular velocity illustrated in FIG. 1 includes a movable body 10, a drive electrode 20, a stopper 30, a hold electrode 40, and a fixed electrode unit 50.

The movable body 10 includes a main mass configuration unit 11, a movable electrode unit 12, an electrode unit 13, a stop structure configuration unit 14, and an electrode unit 15. The main mass configuration unit 11, the movable electrode unit 12, the electrode unit 13, the stop structure configuration unit 14, and the electrode unit 15 are integrally configured and are movable in an X direction and a Y direction (direction perpendicular to the X direction).

The drive electrode 20, to which a drive voltage is applied to forcibly vibrate the movable body 10 in the Y direction (first direction), is provided in the vicinity of the electrode unit 13,. The drive voltage applied to the drive electrode 20 is an AC voltage. It is possible to forcibly vibrate the movable body 10 in the Y direction in accordance with the AC voltage applied to the drive electrode 20.

The stopper 30 is provided in the vicinity of the stop structure configuration unit 14 and has the function of stopping the movable body 10 at a predetermined position. That is, the stop structure configuration unit 14 comes into physical contact with the stopper 30 and thereby it is possible to stop the movable body 10 at the predetermined position. Specifically, the stopper 30 has a recessed portion and is configured such that the stop structure configuration unit 14 of the movable body 10 comes into contact with the stopper in the recessed portion. The electrical potential of the stopper 30 is the same as the electrical potential of the movable body 10, or it is in a floating state. Moreover, in an example illustrated in FIG. 1, two stoppers 30 are provided, but at least one stopper maybe provided and the number of the stoppers may be one or three or more.

The hold electrode 40, to which a hold voltage is applied to hold the movable body 10 in the predetermined position with the stop structure configuration biased against the stopper 30 as described above, is provided in the vicinity of the electrode unit 15. The hold voltage applied to the hold electrode 40 is a DC voltage. An electrostatic attraction force is generated between the hold electrode 40 and the electrode unit 15 by the DC voltage applied to the hold electrode 40 and it is thus possible to attract the electrode unit 15 toward the hold electrode 40. As a result, the stop structure configuration unit 14 formed as an extension of the electrode unit 15 comes into contact with the stopper 30 and the movable body 10 is stopped at a predetermined position. Therefore, when the movable body 10 is held at the predetermined position, the movable body 10 is in contact with the stopper 30 and is not in contact with the hold electrode 40.

The fixed electrode unit 50 is provided in the vicinity of the movable electrode unit 12 and a variable capacitor is configured of portions of the fixed electrode unit 50 and portions of the movable electrode unit 12. It is possible to detect an angular velocity of the movable body 10 by detecting a charge of the capacitance of the variable capacitor. Hereinafter, a description is provided.

When the movable body 10 is rotationally moved while the movable body 10 is driven to vibrate in the Y direction (first direction), the movable body 10 is resultantly vibrated in the X direction (second direction perpendicular to the first direction) by a Coriolis force. In general, the angular velocity of the movable body 10 is proportional to the amplitude of the vibration of the movable body 10 in the X direction as a result of the Coriolis force acting on the movable body 10. Therefore, it is possible to calculate the angular velocity of the movable body 10 from the amplitude of the vibration of the movable body 10 in the X direction resulting from the rotational movement of the movable body 10 and the driven vibration of the movable body 10 in the Y-direction. In the embodiment, if the movable body 10 vibrating in the Y-direction is vibrated in the X direction by the Coriolis force, a distance (interval between electrodes) between the fixed electrode unit and the movable electrode unit 12 changes and the capacitance of the variable capacitor changes. It is possible to obtain the amplitude of the vibration of the movable body 10 in the X direction and to calculate the angular velocity of the movable body 10 by detecting this change of capacitance.

Figure 2:
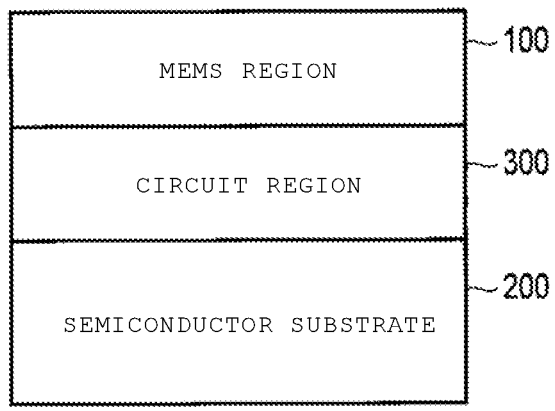
FIG. 2 is a diagram schematically illustrating a configuration when the electronic component for acquiring an angular velocity according to the embodiment is formed on a semiconductor substrate.

Moreover, the electronic component (MEMS component) for acquiring the angular velocity described above is formed on a semiconductor substrate. Specifically, as illustrated in FIG. 2, a circuit region 300 including transistors, wirings, and the like are formed on a semiconductor substrate 200 and a MEMS region 100 including the electronic component (MEMS component) described above are formed on the circuit region 300.

Figure 3:
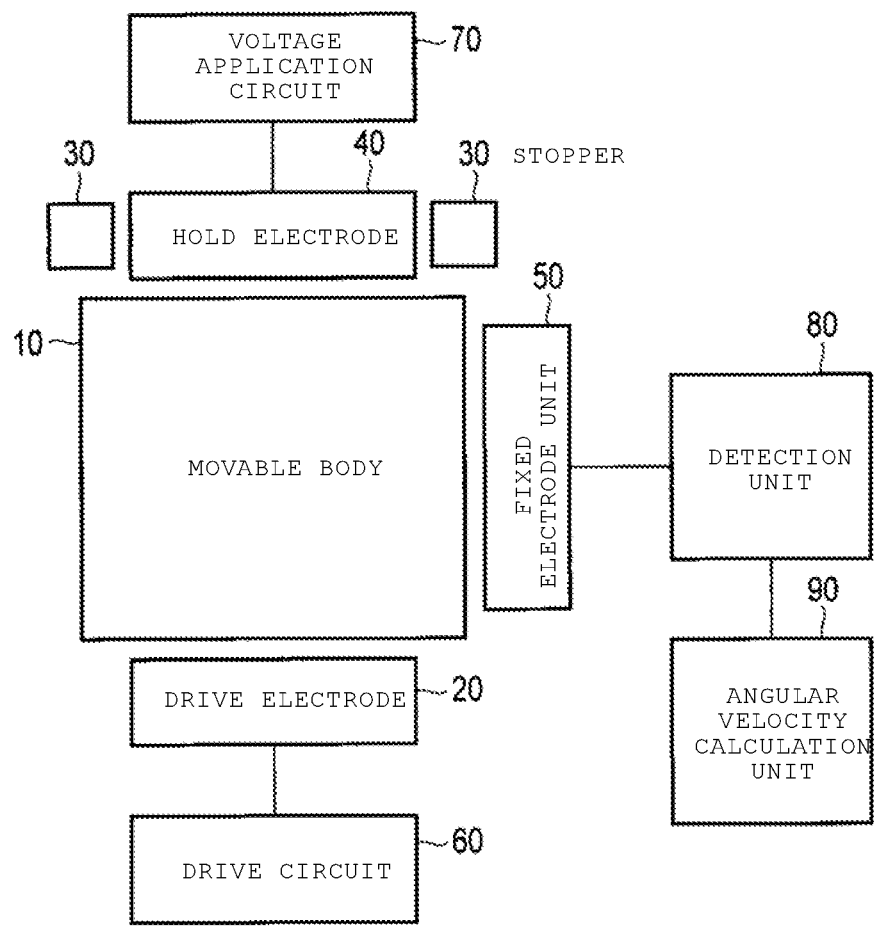
FIG. 3 is a block diagram illustrating an entire configuration of an angular velocity acquisition device according to the embodiment.

FIG. 3 is a block diagram illustrating an entire configuration of an angular velocity acquisition device according to the embodiment.

The angular velocity acquisition device illustrated in FIG. 3 includes a drive circuit 60, a voltage application circuit 70, a detection unit 80, and an angular velocity calculation unit 90 in addition to the configuration illustrated in FIG. 1.

The drive circuit 60 generates a drive voltage (AC voltage) applied to the drive electrode 20. The voltage application circuit 70 generates a hold voltage (DC voltage) applied to the hold electrode 40.

In the detection unit 80, a predetermined physical quantity depending on the amplitude of the vibration of the movable body 10 in the X direction (second direction) is detected based on the Coriolis force acting on the movable body 10 that is driven to vibrate in the Y direction (first direction). In the embodiment, the predetermined physical quantity is a physical quantity based on the capacitance between the movable electrode unit 12 included in the movable body 10 and the fixed electrode unit 50 that is located in the vicinity of the movable electrode unit 12. As already mentioned, if the movable body 10 is vibrated in the X direction by the Coriolis force, the capacitance of the variable capacitor configured with the fixed electrode unit 50 and the movable electrode unit 12 is changed. It is thus possible to obtain the amplitude of the vibration of the movable body 10 in the X direction by detecting the change of capacitance.

Specifically, in the detection unit 80, a potential difference between the fixed electrode unit 50 and the movable electrode unit 12 is detected based on the capacitance of the variable capacitor. It is thus possible to substantially obtain the amplitude of the vibration of the movable body 10 in the X direction by detecting this potential difference.

In the angular velocity calculation unit 90, the angular velocity of the movable body 10 is calculated based on the predetermined physical quantity detected by the detection unit 80. As already mentioned, since the angular velocity is proportional to the amplitude of the vibration of the movable body 10 in the X direction based on the Coriolis force, it is possible to calculate the angular velocity of the movable body 10 based on a detection result in the detection unit 80.

Figure 4:
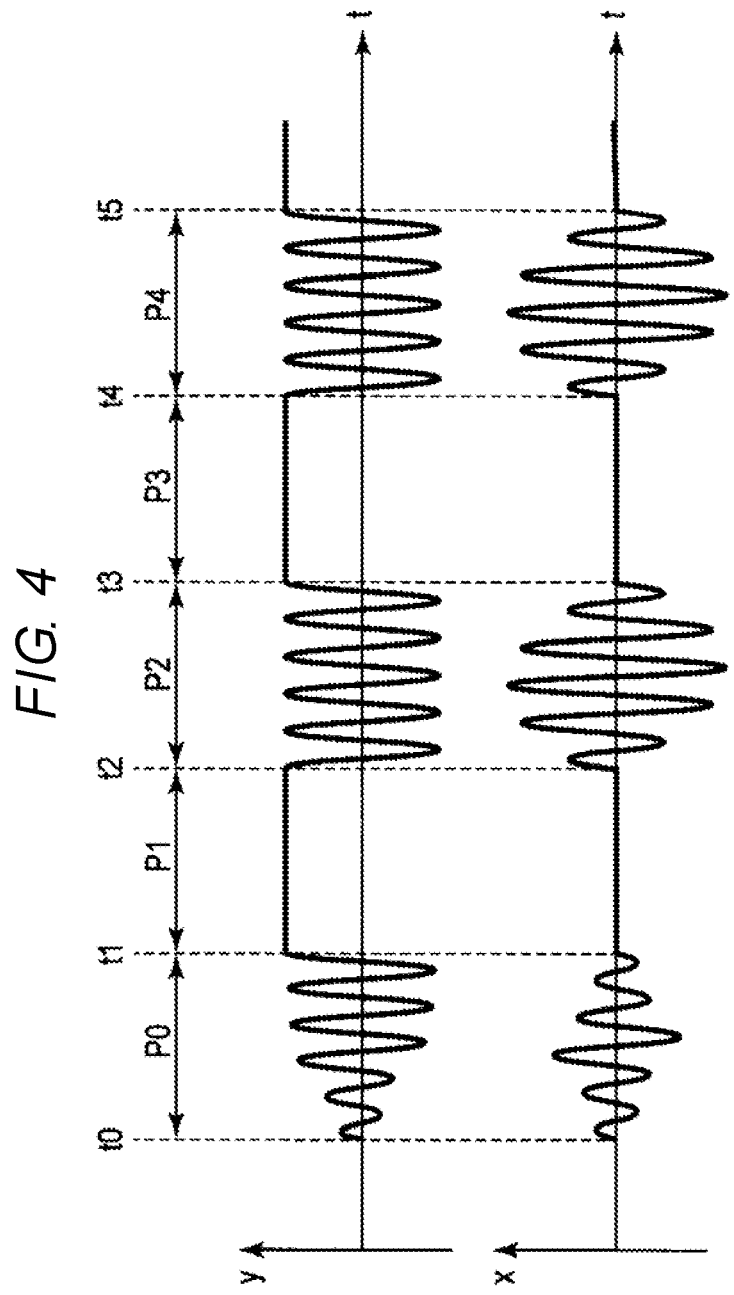
FIG. 4 is a timing chart describing an operation of the angular velocity acquisition device according to the embodiment.

Next, an operation of the angular velocity acquisition device according to the embodiment will be described with reference to a timing chart illustrated in FIG. 4.

First, if the angular velocity acquisition device is actuated, the movable body 10 begins operation from an initial state. In the initial state, the movable body 10 is not held in a predetermined position (the position in a state where the stop structure configuration unit 14 of the movable body 10 is in contact with the stopper 30) and is stationary in a center position of free vibration in the Y direction. In the initial state, the drive voltage (AC voltage) is applied from the drive circuit 60 to the drive electrode 20 and the movable body 10 is forcibly vibrated in the Y direction. In FIG. 4, the forced vibration is started at time t0. Moreover, the application of the drive voltage from the drive circuit 60 to the drive electrode 20 is usually only for the actuation of the angular velocity acquisition device described above.

After the amplitude of the vibration of the movable body 10 in the Y direction reaches a certain level, the forced vibration is stopped at time t1. Specifically, when the amplitude of the vibration of the movable body 10 in the Y direction reaches a peak, a supply of the drive voltage to the drive electrode 20 is stopped and the application of the hold voltage (DC voltage) from the voltage application circuit 70 to the hold electrode 40 is started. The electrostatic attraction force is generated between the hold electrode 40 and the electrode unit 15 by the hold voltage and the electrode unit 15 is attracted to the hold electrode 40. As a result, the stop structure configuration unit 14 comes into contact with the stopper 30 and the movable body 10 is stopped at a predetermined position. In this case, the electrode unit 15 of the movable body 10 does not come into contact with the hold electrode 40. Hereinafter, a period from the time t0 to the time t1 described above is referred to as an initial setting period P0.

Once the initial setting period P0 is completed, a sensing period is started. In the sensing period, the movable body 10 is intermittently vibrated in the Y direction. In the example of FIG. 4, in a period P1 from the time t1 to a time t2 and a period P3 from a time t3 to a time t4, the movable body 10 is held in the predetermined position described above by the hold voltage and the vibration of the movable body 10 is stopped. Hereinafter, a period in which the vibration is stopped is referred to as a hold period. In a period P2 from the time t2 to the time t3 and a period P4 from the time t4 to a time t5, the movable body 10 is vibrated in the Y direction. Hereinafter, a period in which the movable body 10 is vibrated in the Y direction is referred to as a vibration period. Similarly, after the time t5, the hold period and the vibration period are alternately repeated at a fixed period.

When shifting from the hold period to the vibration period, the application of the hold voltage to the hold electrode 40 is stopped. As a result, the movable body 10 is released from the state of being held in the predetermined position and then free vibration in the Y direction is started. That is, in the vibration period, the drive voltage is not supplied from the drive circuit 60 to the drive electrode 20 and the movable body 10 performs free vibration in the Y direction.

A predetermined time is elapsed and the vibration of the movable body 10 in the Y direction reaches the peak after the movable body 10 starts the free vibration, the hold voltage is applied from the voltage application circuit 70 to the hold electrode 40. As a result, similar to an operation at a completion time (time t1) of the initial setting period P0 described above, the electrostatic attraction force is generated between the hold electrode 40 and the electrode unit 15 by the hold voltage applied to the hold electrode 40 and the electrode unit 15 is attracted to the hold electrode 40. Therefore, the stop structure configuration unit 14 comes into contact with the stopper 30 and the movable body 10 is stopped at the predetermined position. In this case, the electrode unit 15 of the movable body 10 does not come into contact with the hold electrode 40.

In the vibration period in which the movable body 10 is freely vibrated in the Y direction, if the movable body 10 is moved rotationally, the movable body 10 is vibrated in the X direction by the Coriolis force. As already mentioned, if the movable body 10 is vibrated in the X direction by the Coriolis force, the distance (interval between the electrodes) between the fixed electrode unit 50 and the movable electrode unit 12 is changed and the capacitance of the variable capacitor configured with the fixed electrode unit 50 and the movable electrode unit 12 is changed. It is possible to obtain the amplitude of the vibration of the movable body 10 in the X direction and to calculate the angular velocity of the movable body 10 by detecting the change of the capacitance.

In the detection unit 80, the predetermined physical quantity is detected based on the capacitance of the variable capacitor described above. That is, in the detection unit 80, the predetermined physical quantity is detected in the vibration period in which the movable body 10 is freely vibrated in the Y direction. Specifically, in the detection unit 80, the voltage potential difference between the fixed electrode unit 50 and the movable electrode unit 12 is detected based on the capacitance of the variable capacitor. It is possible to obtain the amplitude of the vibration of the movable body 10 in the X direction by detecting the voltage potential difference.

In the embodiment, the detection unit 80 detects the predetermined physical quantity described above when the vibration in the X direction based on the Coriolis force acting on the movable body 10 is in a non-steady state. Hereinafter, description is provided in this regard.

Figure 5:
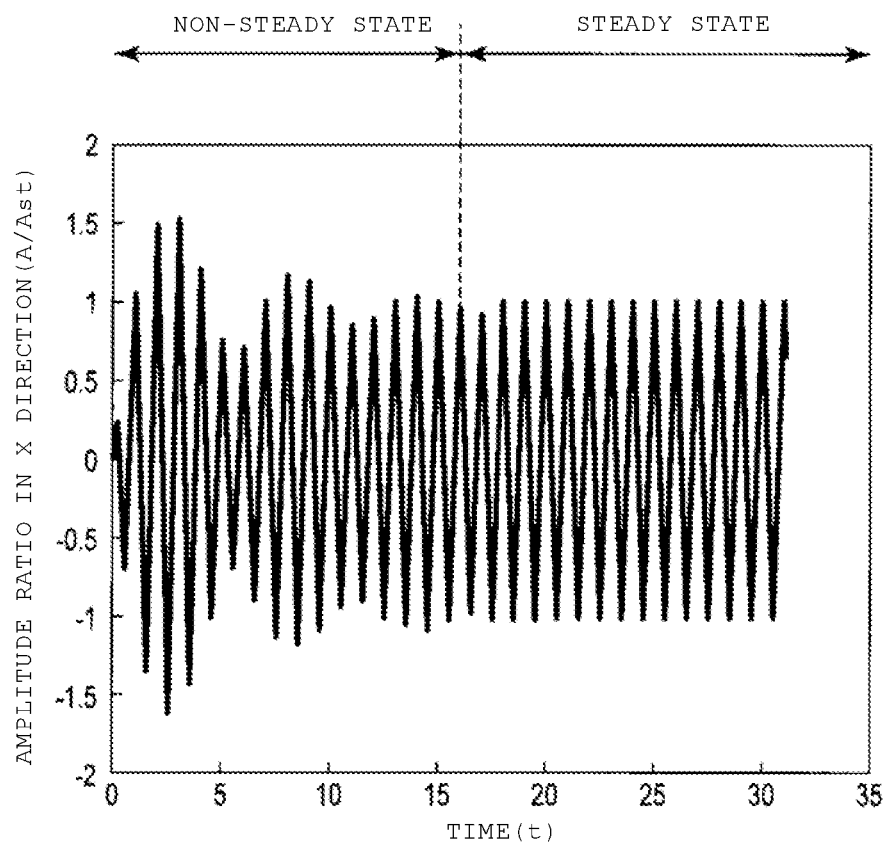
FIG. 5 is a graph illustrating an example of vibration of a movable body based on a Coriolis force.

FIG. 5 is a graph illustrating an example of the vibration of the movable body 10 in the X direction based on the Coriolis force. The vertical axis indicates an amplitude ratio (A/Ast), where "A" is the amplitude of the vibration of the movable body 10 in the X direction and "Ast" is the amplitude of the steady state vibration of the movable body 10 in the X direction.

As illustrated in FIG. 5, the vibration of the movable body 10 in the X direction shifts to steady state vibration after the non-steady state vibration is generated. In the non-steady state, the amplitude of the vibration is changed and in the steady state, the amplitude of the vibration is constant. In addition, in the embodiment, a mass component of the movable body 10 in the X direction and amass component in the Y direction are adjusted so that a beat (regular oscillation period) is generated in the vibration in the X direction in a desired period in the non-steady state. Thus, in the example illustrated in FIG. 5, during the non-steady state vibration, the beat is generated.

As can be seen from the above description, a certain time is required until the vibration in the X direction reaches the steady state condition. Therefore, to detect the predetermined physical quantity when the vibration is in the steady state, the passage of a certain period of time is required. It is possible to perform the detection of the predetermined physical quantity in a short period of time by performing the detection operation when the vibration is in the non-steady state.

As described above, in the embodiment, the predetermined physical quantity is detected based on the Coriolis force acting on the movable body 10 when the vibration in the X direction is in the non-steady state. Therefore, in the embodiment, as illustrated in FIG. 4, the vibration period is completed before the vibration in the X direction reaches the steady state. That is, the hold voltage is applied to the hold electrode 40 before the vibration in the X direction reaches the steady state and thus the movable body 10 is moved to and held in the predetermined position before the vibration in the X direction reaches the steady state.

As described above, the predetermined physical quantity detected by the detection unit 80 is transmitted to the angular velocity calculation unit 90 and the angular velocity of the movable body 10 is calculated in the angular velocity calculation unit 90 based on the predetermined physical quantity. Since the angular velocity is proportional to the amplitude of the vibration of the movable body 10 in the X direction based on the Coriolis force, it is possible to calculate the angular velocity of the movable body 10 based on the detection result in the detection unit 80.

As described above, in the embodiment, it is possible to hold the movable body 10 in the predetermined position by providing the stopper 30 and the hold electrode 40. Then, free vibration is generated in the movable body 10 by releasing the movable body 10 from a state of being held in the predetermined position and the predetermined physical quantity is detected within the period in which the movable body 10 is freely vibrated. In the hold operation of the movable body 10 and the free vibration operation of the movable body 10 described above, minimal power is consumed. Therefore, in the embodiment, it is possible to reduce power consumption of the gyro sensor and to form an angular velocity acquisition device having low power consumption.

Moreover, in the embodiment described above, the predetermined physical quantity is detected when the vibration in the X direction is in the non-steady state based on the Coriolis force, but the predetermined physical quantity may be detected when the vibration in the X direction is in the steady state based on the Coriolis force.

Next, various configuration examples of the hold electrode 40 will be described.

Figure 6:
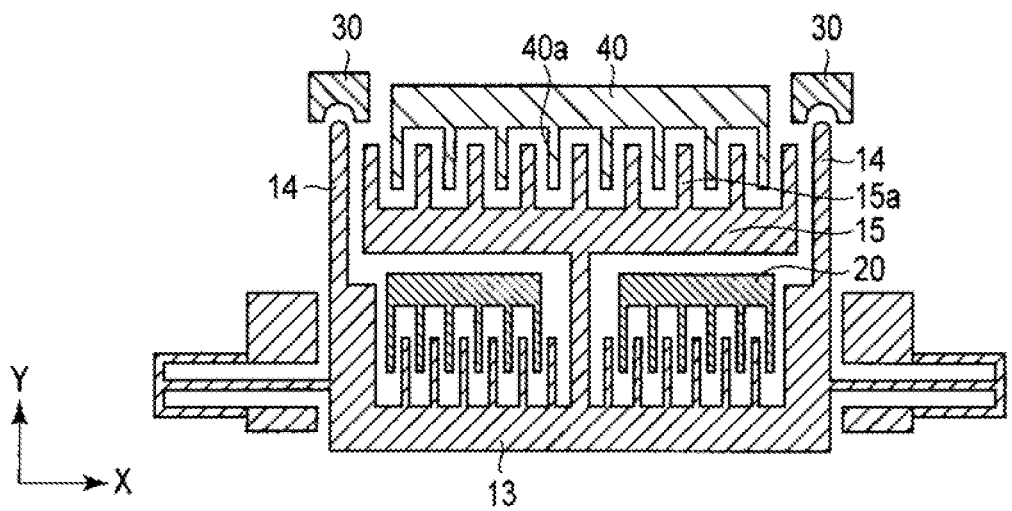
FIG. 6 is a plan view schematically illustrating a first configuration example of a hold electrode of an electronic component for acquiring the angular velocity according to the embodiment.

FIG. 6 is a plan view schematically illustrating a first configuration example of the hold electrode 40. In the configuration example, the electrode unit 15 of the movable body 10 has a plurality of comb-shaped protrusion portions 15a and the hold electrode 40 has a plurality of comb-shaped protrusion portions 40a. The protrusion portions 15a of the electrode unit 15 and the protrusion portions 40a of the hold electrode 40 are alternately disposed. Specifically, in the configuration example, both the protrusion portions 15a of the electrode unit 15 of the movable body 10 and the protrusion portions 40a of the hold electrode 40 protrude in the Y direction (first direction) and are arranged along and spaced apart in the X direction (second direction). As described above, the protrusion portions 15a of the electrode unit 15 of the movable body 10 and the protrusion portions 40a of the hold electrode 40 are alternately disposed, i.e., interdigitated. Thus, it is possible to increase the area of the facing portions of the electrode unit 15 and the hold electrode 40 and thereby increase the electrostatic attraction force between the electrode unit 15 and the hold electrode 40.

Figure 7:
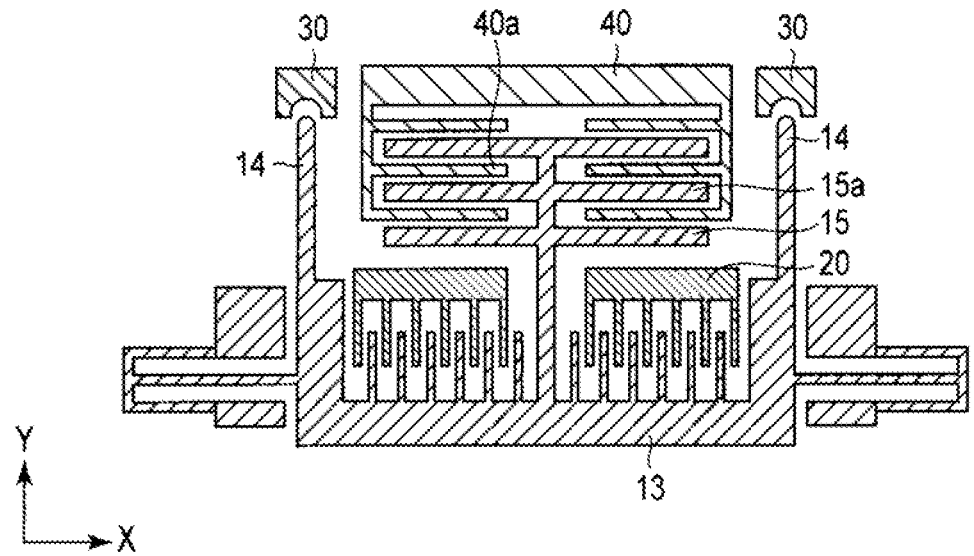
FIG. 7 is a plan view schematically illustrating a second configuration example of the hold electrode of the electronic component for acquiring the angular velocity according to the embodiment.

FIG. 7 is a plan view schematically illustrating a second configuration example of the hold electrode 40. Also in the configuration example, an electrode unit 15 of a movable body 10 has a plurality of protrusion portions 15a and a hold electrode 40 has a plurality of protrusion portions 40a. The protrusion portions 15a of the electrode unit 15 and the protrusion portions 40a of the hold electrode 40 are alternately disposed. Specifically, in the configuration example, both the protrusion portions 15a of the electrode unit 15 of the movable body 10 and the protrusion portions 40a of the hold electrode 40 extend in the X direction (second direction) and are alternately arranged (interdigitated) and spaced apart in the Y direction (first direction). Also in the configuration example, similar to the first configuration example, it is possible to increase the area of the facing portions of the electrode unit 15 and the hold electrode 40 and thereby increase the electrostatic attraction force between the electrode unit 15 and the hold electrode 40. In addition, in the configuration example, since the interval between the protrusion portions 40a of the hold electrode 40 and the protrusion portions 15a of the electrode unit 15 of the movable body 10 can be reduced, it is possible to increase the electrostatic attraction force between the electrode unit 15 and the hold electrode 40.

Figure 8:
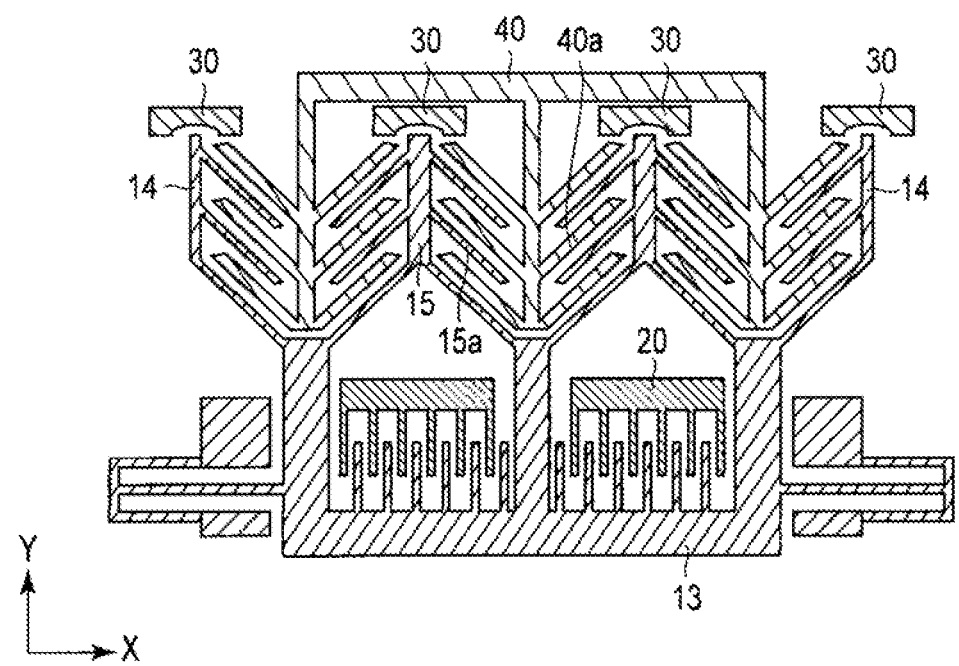
FIG. 8 is a plan view schematically illustrating a third configuration example of the hold electrode of the electronic component for acquiring the angular velocity according to the embodiment.

FIG. 8 is a plan view schematically illustrating a third configuration example of the hold electrode 40. Also in the configuration example, an electrode unit 15 of a movable body 10 has a plurality of protrusion portions 15a and the hold electrode 40 has a plurality of protrusion portions 40a. The protrusion portions 15a of the electrode unit 15 and the protrusion portions 40a of the hold electrode 40 are alternately disposed. Specifically, in the configuration example, both the protrusion portions 15a of the electrode unit 15 of the movable body 10 and the protrusion portions 40a of the hold electrode 40 protrude in a direction inclined with respect to the Y direction (first direction) and are arranged (interdigitated) and spaced in the Y direction (first direction). In the configuration example, since the protrusion portions 15a and the protrusion portions 40a extend in the inclined direction with respect to the Y-direction, it is possible to increase the area of a facing portions of the electrode unit 15 and the hold electrode 40 and thereby increase the electrostatic attraction force between the electrode unit 15 and the hold electrode 40.

Next, various configuration examples of the stopper 30 will be described.

Figure 9:
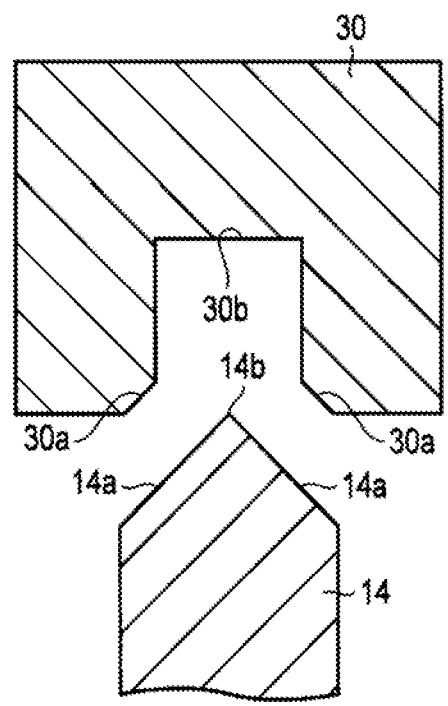
FIG. 9 is a plan view schematically illustrating a first configuration example of a stopper of the electronic component for acquiring the angular velocity according to the embodiment.

FIG. 9 is a plan view schematically illustrating a first configuration example of the stopper 30. In the configuration example, the stopper 30 has a pair of inclined surfaces 30a configured to contact the stop structure configuration unit 14 of a movable body 10. In addition, a tip of the stop structure configuration unit 14 of the movable body 10 has a similar or matching pair of inclined surfaces 14a. The inclined surfaces 30a of the stopper 30 and the inclined surfaces 14a of the stop structure configuration unit 14 are configured to come into contact with each other. In addition, in a state where the inclined surface 30a and the inclined surface 14a come into contact with each other, a leading end 14b of the stop structure configuration unit 14 is configured to extend a distance whereby it does not come into contact with the bottom surface 30b of a recessed portion of the stopper 30. In the configuration example, it is possible to reliably hold the stop structure configuration unit 14 of the movable body 10 in a regular position by the pair of inclined surfaces 30a of the stopper 30 aligning the included surfaces of the stop structure configuration unit to center it in the stop structure 30. In addition, in the configuration example, since the leading end 14b of the stop structure configuration unit 14 does not come into contact with the bottom surface 30b of the recessed portion of the stopper 30, it is possible to prevent wear of the leading end 14b of the stop structure configuration unit 14.

Figure 10:
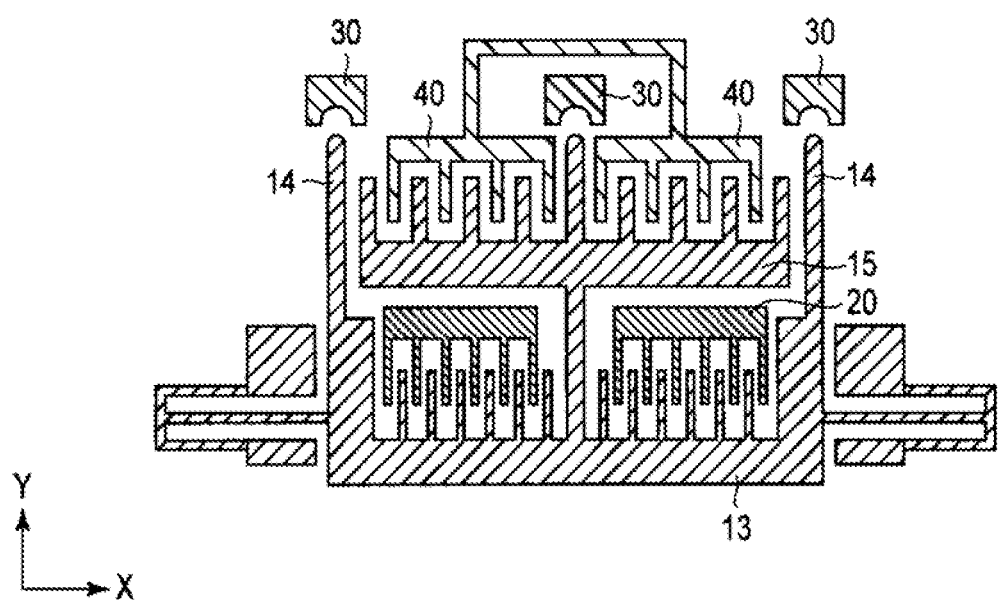
FIG. 10 is a plan view schematically illustrating a second configuration example of the stopper of the electronic component for acquiring the angular velocity according to the embodiment.

FIG. 10 is a plan view schematically illustrating a second configuration example of the stopper 30. In the embodiment illustrated in FIG. 1, two stoppers 30 are provided in positions corresponding to the opposed sides of the movable body 10, but in the configuration example, the stopper 30 is also further provided in a position corresponding to the center of the movable body 10. As described above, it is possible to prevent the movable body 10 from being bent in the center portion and to suppress deformation (particularly, deformation of the electrode unit 15) of the movable body 10 by also providing the stopper 30 in the center portion when the stop structure configuration unit 14 of the movable body 10 comes into contact with the stopper 30.

Figure 11A:
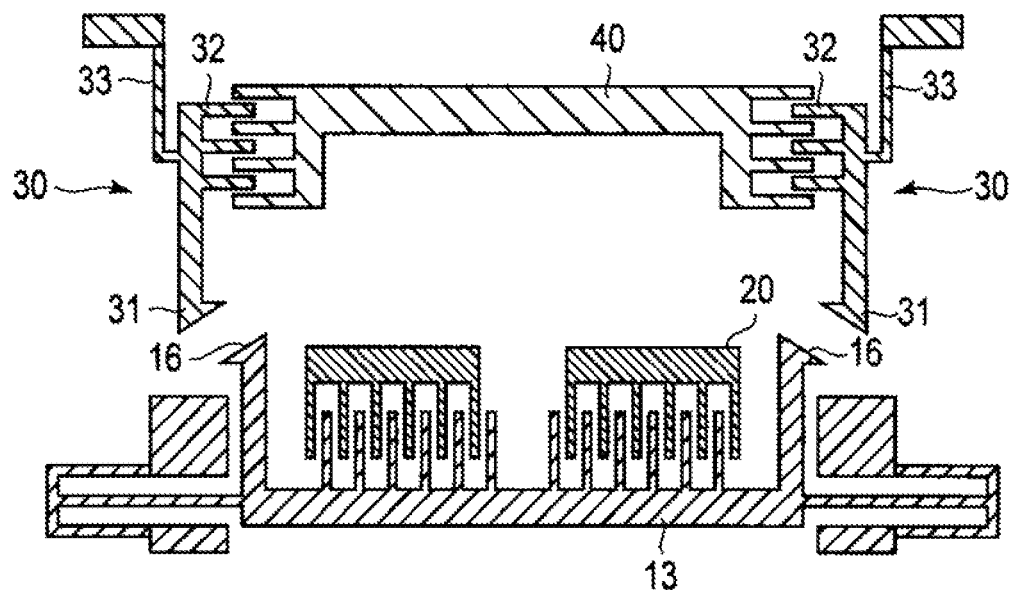
FIGS. 11A and 11B are plan views schematically illustrating a third configuration example of the stopper of the electronic component for acquiring the angular velocity according to the embodiment.
Figure 11B:
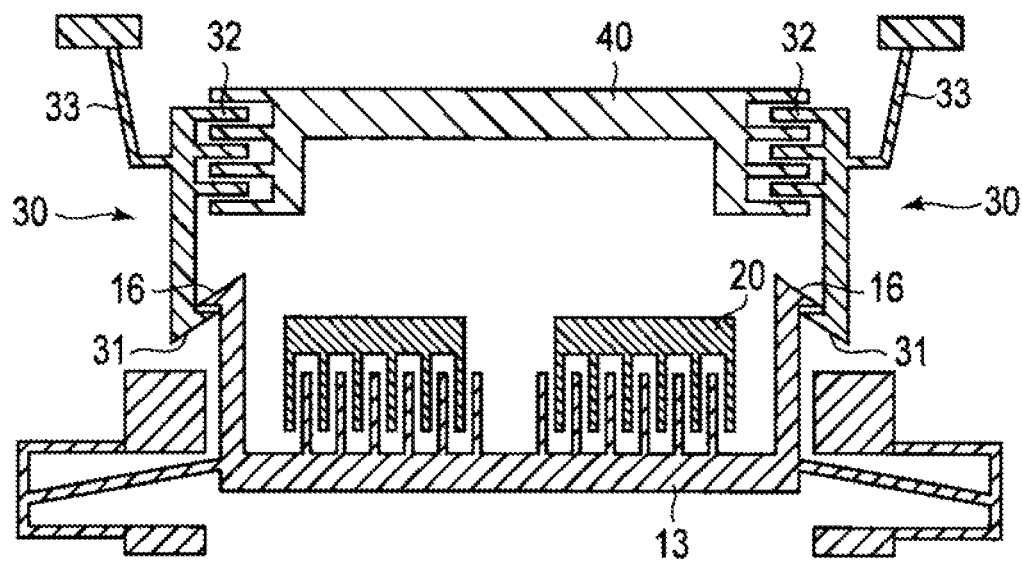

FIGS. 11A and 11B are plan views schematically illustrating a third configuration example of the stopper 30. FIG. 11A illustrates a state before a hold voltage is applied to a hold electrode 40 and FIG. 11B illustrates a state where the hold voltage is applied to the hold electrode 40. In the configuration example, the stopper 30 includes engaging portions (claw portions) 31, electrode units 32, and spring portions 33. As already mentioned, if the hold voltage is applied to the hold electrode 40, the electrostatic attraction force is generated between the hold electrode 40 and the electrode units 32 of the stopper 30, and the electrode units 32 are attracted to the hold electrode 40. As a result, the engaging portions (claw portions) 31 of the stopper 30 and engaging portions (claw portions) 16 of the movable body 10 are engaged, and it is possible to stop the movable body 10 in a predetermined position.

Hereinafter, contents of the embodiments described above are appended.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein maybe made without departing from the spirit of the inventions. The accompanying claims and their equivalents are intended to cover such forms or modifications as would fall within the scope and spirit of the inventions.

What is claimed is:

1. An electronic component comprising:
a movable body;
a drive electrode configured to receive a drive voltage to vibrate the movable body in a first direction;
at least one stopper positioned to limit movement of the movable body in the first direction and configured to stop the movable body at a predetermined position along the first direction;
a hold electrode; and
a voltage application circuit configured to apply a hold voltage to the hold electrode to hold the movable body at the predetermined position, and terminate application of the hold voltage to the hold electrode at the predetermined position, such that the movable body is released from holding and vibrates in the first direction,
wherein the movable body includes a movable electrode that forms a variable capacitor with another electrode, a capacitance of the variable capacitor being used to detect a predetermined physical quantity depending on an amplitude of a vibration of the movable body in a second direction based on a Coriolis force acting on the movable body vibrating in the first direction, and
when the movable body is in contact with the stopper and stopped at the predetermined position, the movable body is not in contact with the hold electrode.

2. The component according to claim 1,
wherein the movable body has a plurality of protrusion portions and the hold electrode has a plurality of protrusion portions, and
wherein the protrusion portions of the movable body and the protrusion portions of the hold electrode are interdigitated.

3. The component according to claim 1, further comprising:
a detection unit configured to detect the predetermined physical quantity based on the Coriolis force acting on the movable body when the vibration in the second direction is in a non-steady state.

4. The component according to claim 1, further comprising:
a detection unit configured to detect the predetermined physical quantity when the movable body is freely vibrated in the first direction.

5. The component according to claim 1, wherein
upon release from the holding, the movable body is enabled to vibrate in the second direction in a non-steady state condition and a steady state condition, and
the component further comprises a detection unit configured to detect the predetermined physical quantity based on the Coriolis force acting on the movable body when the vibration in the second direction is in a non-steady state condition.

6. The component according to claim 1, wherein the voltage application circuit applies the hold voltage to the hold electrode when the amplitude of the vibration of the movable body in the first direction reaches a peak.

7. The component according to claim 2, wherein the protrusion portions of the movable body and the protrusion portions of the hold electrode extend in the second direction that is not parallel to the first direction.

8. The component according to claim 7, wherein the second direction is perpendicular to the first direction.

9. The component according to claim 2, wherein the protrusion portions of the movable body and the protrusion portions of the hold electrode extend in a second direction that is parallel to the first direction.

10. The component according to claim 1, wherein
the voltage application circuit is configured to apply the hold voltage to the hold electrode during a first period and terminate application of the hold voltage to the hold electrode during a second period, the first period and the second period alternating.

* * * * *